United States Patent

Matocha et al.

(10) Patent No.: US 10,651,860 B2
(45) Date of Patent: May 12, 2020

(54) ASYNCHRONOUS POSITIONAL FEEDBACK FOR ASYNCHRONOUS AND ISOCHRONOUS COMMUNICATION

(71) Applicant: Cirrus Logic International Semiconductor Ltd., Edinburgh (GB)

(72) Inventors: Jason Matocha, Pflugerville, TX (US); Marc Kobayashi, Austin, TX (US); Bruce E. Duewer, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 140 days.

(21) Appl. No.: 15/926,424

(22) Filed: Mar. 20, 2018

(65) Prior Publication Data

US 2018/0367151 A1 Dec. 20, 2018

Related U.S. Application Data

(60) Provisional application No. 62/520,168, filed on Jun. 15, 2017.

(51) Int. Cl.
*H03L 7/099* (2006.01)
*H03L 7/081* (2006.01)
*G06F 3/16* (2006.01)
*G06F 13/42* (2006.01)

(52) U.S. Cl.
CPC ............ *H03L 7/0991* (2013.01); *G06F 3/165* (2013.01); *H03L 7/0814* (2013.01); *G06F 13/42* (2013.01)

(58) Field of Classification Search
CPC . G06F 1/12; G06F 13/385; G06F 1/10; G06F 1/3215; G06F 13/4282; G06F 2213/0042; H03L 7/0814
See application file for complete search history.

(56) References Cited

U.S. PATENT DOCUMENTS

| 6,169,747 | B1 * | 1/2001 | Sartain | H04N 21/23406 341/61 |
| 2017/0373881 | A1 * | 12/2017 | Yu | H04J 3/0632 |
| 2019/0025872 | A1 * | 1/2019 | Li | G06F 1/12 |

* cited by examiner

*Primary Examiner* — Vineeta S Panwalkar
(74) *Attorney, Agent, or Firm* — Jackson Walker L.L.P.

(57) ABSTRACT

A method of generating asynchronous feedback information for asynchronous, isochronous audio communication may include determining a relative change of stored samples in a device and generating the asynchronous feedback information provided to a host from the device based on the relative change. A method of generating asynchronous feedback information for asynchronous, isochronous audio communication may include determining a relative phase of a host clock for a host and a device clock for a device and generating the asynchronous feedback information provided to the host from the device based on the relative phase.

24 Claims, 4 Drawing Sheets

ASYNCHRONOUS POSITIONAL FEEDBACK FOR ASYNCHRONOUS AND ISOCHRONOUS COMMUNICATION

RELATED APPLICATION

The present disclosure claims priority to U.S. Provisional Patent Application Ser. No. 62/520,168, filed Jun. 15, 2017, which is incorporated by reference herein in its entirety.

FIELD OF DISCLOSURE

The present disclosure relates in general to circuits for electronic devices, including without limitation audio devices, including personal audio devices such as wireless telephones and media players, and more specifically, to systems and methods relating to providing, by a device to a host, asynchronous position feedback for asynchronous and isochronous communication.

BACKGROUND

Universal Serial Bus ("USB") is a well-known industry communication protocol for electronic devices. USB provides a well-defined standard protocol that allows electronic devices to communicate with each other and to provide power delivery to them as well. Various versions of the USB protocol exist, such as USB 1.x, USB 2.0, USB 3.0, USB 3.1, USB-C.

An existing method for isochronous data synchronization for Universal Serial Bus ("USB"), USB Audio Class ("UAC") 1.0 and UAC 2.0 audio is called asynchronous. From the UAC 2.0 specification, "asynchronous isochronous audio endpoints produce or consume data at a rate that is locked either to a clock external to the USB or to a free-running internal clock. These endpoints cannot be synchronized to a start of frame (SOF) or to any other clock in the USB domain." Because the device clock and USB clock are not synchronized, there is a high probability that the device will produce or consume data at a different rate than the host. This asynchronous condition will inevitably result in the device having too much or not enough data to consume or produce resulting in audio distortion because of loss of data.

Current USB 2.0, UAC 1.0 and UAC 2.0 specifications instruct developers implementing an isochronous endpoint using asynchronous synchronization type to "provide explicit feedback to the host by indicating accurately what its desired data rate (Ff) is, relative to the USB (micro)frame frequency" in order to maintain data synchronization between the host and device. The feedback information sent is either a 10.10 (for full speed) or 16.16 (for high speed) value that represents the desired data rate at which audio samples should be sent to the device to prevent loss of audio synchronization, resulting in poor audio quality. This data provides the host with information on how the rate at which it sends the samples to the device changes.

The USB 2.0 specification suggests calculating the explicit feedback using the local device clock to determine the actual sampling rate referenced to the USB start of frame (SOF), or the USB frame or microframe frequency. This actual sampling rate is then used by the device to calculate the rate required from the host to maintain synchronization. However, this approach has many disadvantages, including:

1. The feedback information sent is a quantized ratio of analog clock frequencies, and the reported value will most likely be close but not the exact ratio. Accumulation of such quantization errors over time makes it possible for the audio samples to underflow or overflow an audio buffer.

2. There could be a delay in calculating the clock ratios, and as a result, the device may be subject to loss of buffer centering. Increased loss of buffer centering increases the possibility of buffer underflow or overflow. Over time, due to lack of loss of buffer centering, the device buffers could be within one sample of underflow or overflow before the host adjusts the samples being sent. Even if the host is sending samples at a perfect rate, the buffer may still remain one sample away from underflow or overflow. The clocks used may be subject to temperature and/or voltage drift, and before the feedback can be updated, the device buffer may underflow or overflow due to environmental changes.

3. Measuring the SOF clock with respect to the system clock may be difficult and have variance due to such things as system interrupts.

4. The USB specification does not detail a time for the host to respond to the synchronization feedback given by the device, resulting in varying response times among different USB host hardware and software implementations.

SUMMARY

In accordance with the teachings of the present disclosure, one or more disadvantages and problems associated with existing approaches for providing feedback from a device to a host communicatively coupled to the device may be reduced or eliminated.

In accordance with embodiments of the present disclosure, a method of generating asynchronous feedback information for asynchronous, isochronous audio communication may include determining a relative change of stored samples in a device and generating the asynchronous feedback information provided to a host from the device based on the relative change.

In accordance with these and other embodiments of the present disclosure, a method of generating asynchronous feedback information for asynchronous, isochronous audio communication may include determining a relative phase of a host clock for a host and a device clock for a device and generating the asynchronous feedback information provided to the host from the device based on the relative phase.

In accordance with these and other embodiments of the present disclosure, a device may include a bus interface for communicating with a host communicatively coupled to the device and a controller communicatively coupled to the bus interface and configured to, in order to generate asynchronous feedback information for asynchronous, isochronous audio communication, determine a relative change of stored samples in the device and generate the asynchronous feedback information provided to the host from the device based on the relative change.

In accordance with these and other embodiments of the present disclosure, a device may include a bus interface for communicating with a host communicatively coupled to the device and a controller communicatively coupled to the bus interface and configured to, in order to generate asynchronous feedback information for asynchronous, isochronous audio communication, determine a relative phase of a host clock for a host and a device clock for a device and generate the asynchronous feedback information provided to the host from the device based on the relative phase.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
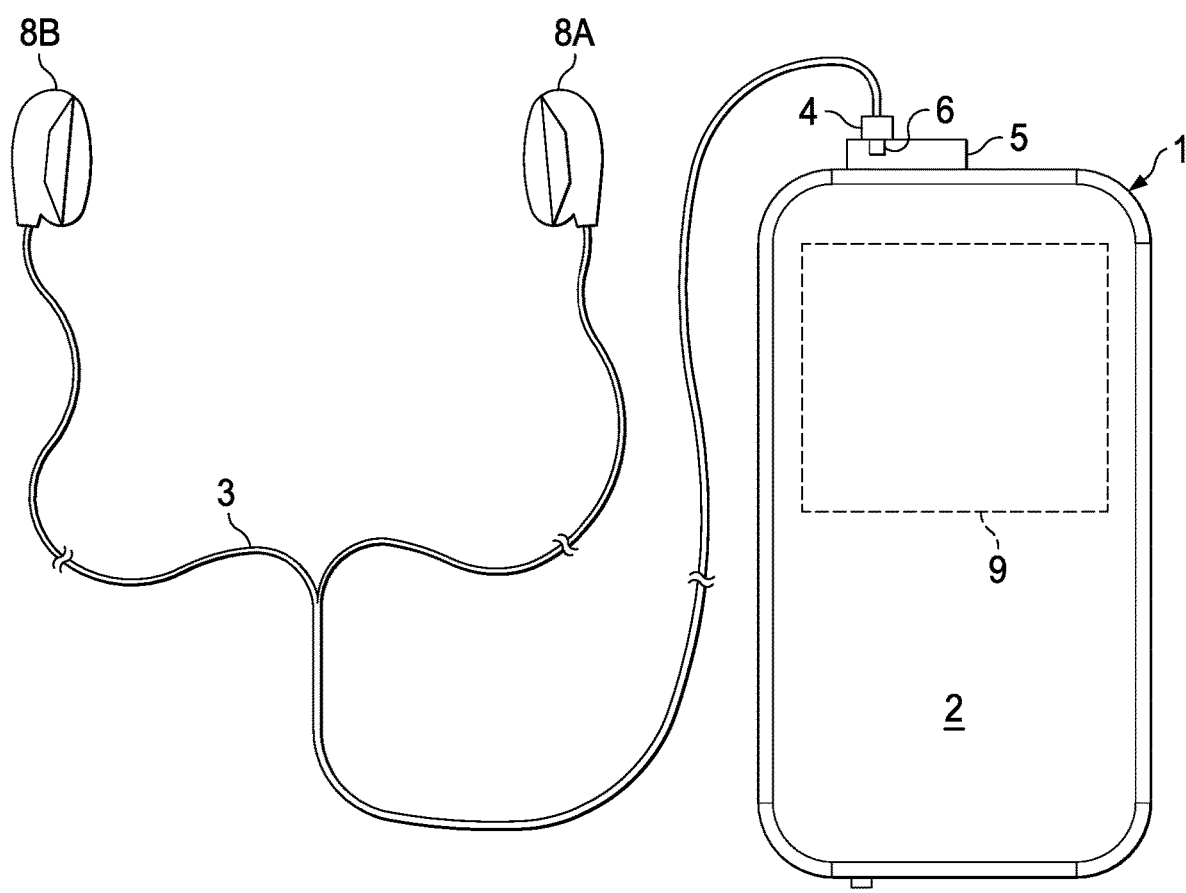
FIG. 1 illustrates an example personal audio device, in accordance with embodiments of the present disclosure.

FIG. 1 illustrates an example personal audio device 1, in accordance with embodiments of the present disclosure. Personal audio device 1 as depicted in FIG. 1 represents one of many types of devices that may operate as a host for communication over a communication protocol bus, such as USB for example. For instance, notebook computers, laptop computers, tablet computers, and desktop computers may also be examples of devices that may operate as a host for coupling to a device for purposes of this disclosure.

As shown in FIG. 1, personal audio device 1 may have coupled thereto a device 5, such as a USB device or adapter, for example. Device 5 may include a port 6 which serves as an electrical terminal for receiving one or more other peripheral devices, such that device 5 may serve as an interface between such one or more peripheral devices and personal audio device 1. As a non-limiting example, FIG. 1 depicts a headset 3 in the form of a pair of earbud speakers 8A and 8B, wherein headset 3 is coupled to personal audio device 1 via device 5. Headset 3 depicted in FIG. 1 is merely an example of a peripheral device, and it is understood that personal audio device 1 or any other suitable host may be used in connection with a variety of peripheral devices, including other audio devices (e.g., headphones, earbuds, in-ear earphones, and external speakers) or non-audio devices (optical devices, storage media, etc.). A plug 4 may provide for connection of headset 3 to port 6 of device 5. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include a processor 9 for controlling operation of personal audio device 1, and device 5 and headset 3 coupled thereto. As described in greater detail below, processor 9 may include or otherwise implement a plug-and-play device controller for managing device 5 and peripheral devices coupled thereto.

Figure 2:
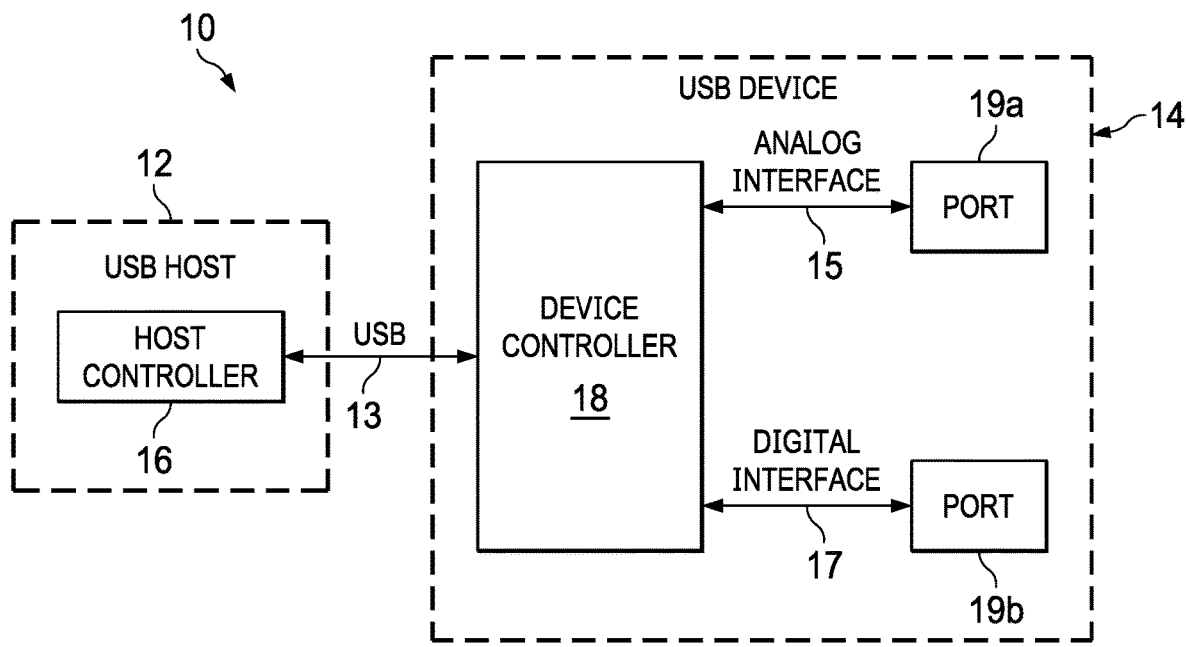
FIG. 2 illustrates a block diagram of an example system having a USB host and a USB device coupled via a USB bus, in accordance with embodiments of the present disclosure.

FIG. 2 illustrates a block diagram of example system 10 having a USB host 12 and a USB device 14 coupled via a USB bus 13, in accordance with embodiments of the present disclosure. USB host 12 may be any suitable host device, including without limitation personal audio device 1 depicted in FIG. 1. As shown in FIG. 2, USB host 12 may include, among other components, a host controller 16, as is known in the art. Host controllers and their functionality for providing an interface between a host system and other devices are well-known in the art.

USB device 14 may be any suitable peripheral device, including without limitation device 5 depicted in FIG. 1. As depicted in FIG. 2, USB device 14 may include a device controller 18 and a plurality of ports 19 (e.g., port 19a and port 19b). In some embodiments, port 19a may comprise an analog port coupled to device controller 18 via an analog interface 15, and may support analog devices including, without limitation, a line input device, a headset with a microphone, a headset without a microphone, a mono microphone, and/or a stereo microphone. As another example, port 19b may comprise a digital port coupled to device controller 18 via a digital interface 17, and may support digital devices including, without limitation, an optical input device and an optical output device. Thus, the appropriate device capabilities of USB device 14 may depend on what peripheral devices are inserted into ports 19.

Figure 3:
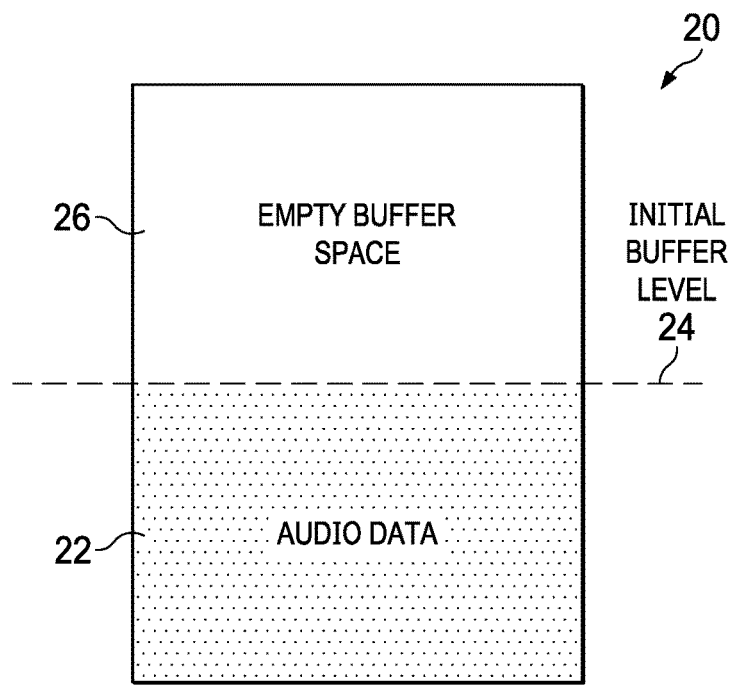
FIG. 3 illustrates a block diagram of a buffer that may be maintained by a device controller for buffering audio data, in accordance with embodiments of the present disclosure.

Many devices (e.g., device 5 of FIG. 1 and/or USB device 14 of FIG. 2) that handle streaming audio may accumulate or buffer a certain amount of data before they begin processing the data. Such buffering may reduce the need for the device to handle the data as soon as it is received at the device. As long as the device processes the data in a timely matter, other operations may be performed and completed by the device. FIG. 3 illustrates a block diagram of a buffer 20 that may be maintained by device controller 18 for buffering audio data, in accordance with embodiments of the present disclosure. As shown in FIG. 3, device controller 18 may initially buffer within buffer 20 an amount of audio data 22 as indicated by initial buffer level 24, leaving a portion of buffer 20 as empty buffer space 26.

However, as stated above, feedback data that is communicated from USB device 14 to USB host 12 may be a quantized ratio of analog clock frequencies, and the reported value will most likely be close to but not equal to the exact ratio. Thus, over time, audio data 22 in buffer 20 may slowly increase or decrease depending on a clock difference between USB host 12 and device 14.

Figure 4:
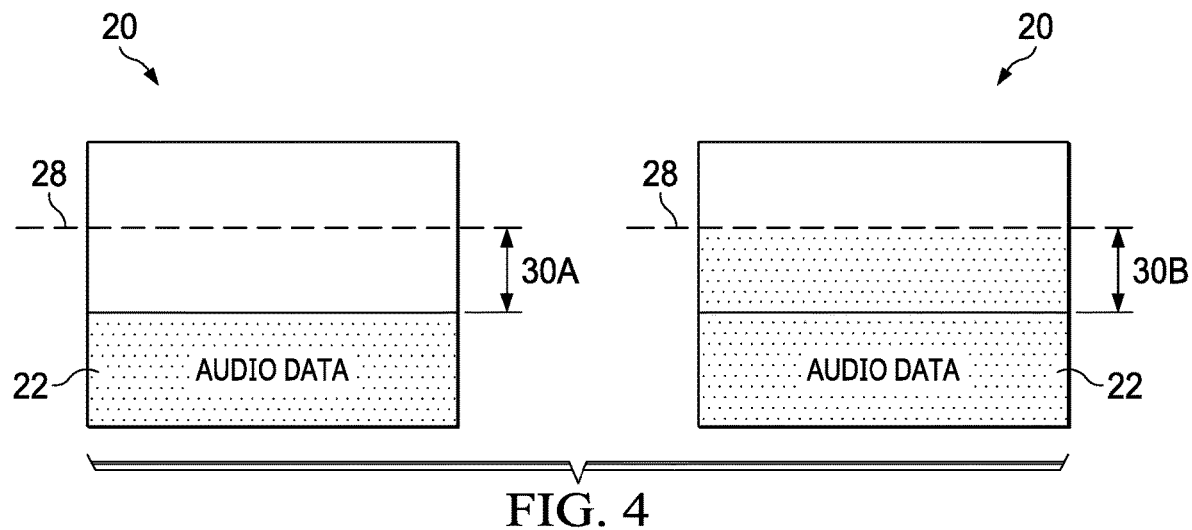
FIG. 4 illustrates a block diagram of a buffer depicting calculation of a buffer level offset for asynchronous feedback from a device to a host, in accordance with embodiments of the present disclosure.

To overcome these disadvantages of existing approaches to bus communication as described above, device controller 18 may, as described in greater detail herein, periodically monitor an amount of audio data 22 in buffer 20 associated with an isochronous endpoint (e.g., USB device 14) and based on such monitoring, adjust a feedback value communicated from USB device 14 to USB host 12 in order to maintain synchronization and to account for varying response times of USB host 12. The feedback value may comprise a buffer level offset indicative of a relative change of samples stored in buffer 20, as shown in FIG. 4. FIG. 4 illustrates a block diagram of a buffer depicting calculation of a buffer level offset for asynchronous feedback from a device to a host, in accordance with embodiments of the present disclosure. FIG. 4 depicts on the left a situation in which an amount of audio data 22 present in buffer 20 is below a desired buffer level 28 by an offset 30A and depicts on the right a situation in which an amount of audio data 22 present in buffer 20 is above a desired buffer level 28 by an offset 30B. The calculated buffer offset (e.g., offset 30A or 30B) may be used to adjust the feedback information communicated from USB device 14 to USB host 12. For example, in some embodiments, device controller 18 may use such calculated offset to index a look up table of values, and report an indexed value to USB host 12.

This approach of monitoring buffer 20 and adjusting a feedback value indicative of offset in response thereto may be used as the only mechanism for calculating the feedback value or may be used in conjunction with other approaches including, without limitation, measuring a start of frame (SOF) period in terms of a local clock of USB device 14 and calculating a number of samples per frame with respect to the SOF and/or measuring a frequency of SOFs and phase of SOFs with respect to the local clock of USB device 14. In some embodiments, measuring frequency and phase can be used without monitoring the data buffers in order to calculate the feedback value.

Figure 5:
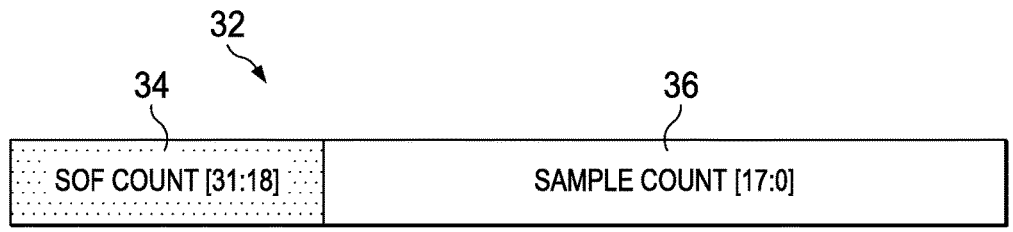
FIG. 5 illustrates a block diagram of a hardware register for storing information for comparing a host clock to a device clock, in accordance with embodiments of the present disclosure.

In embodiments of USB device 14 in which device controller 18 is capable of comparing a local clock of USB device 14 with a host clock of USB host 12, then the feedback value communicated from USB device 14 to USB host 12 may be calculated from a comparison of clock values. For example, device controller 18 may maintain a hardware register 32, an example of which is depicted in FIG. 5. As shown in FIG. 5, hardware register 32 may include an SOF counter field 34 for counting a number of SOFs received by USB device 14 from USB host 12 and a sample counter field 36 for counting a number of samples received by USB device 14 from USB host 12, from which device controller 18 can determine a number of samples received per SOF period. Hardware register 32 may be of a suitable size (e.g., 32 bits as shown in FIG. 5) and each of SOF counter field 34 and sample counter field 36 may be of any suitable size (e.g., 14 and 18 bits, respectively, as shown in FIG. 5). Such a hardware register 32 may be used to provide feedback information, but the data therein may be quantized and may not comprise an accurate value. This value is the relative rate of the device clock to the host clock.

Figure 6:
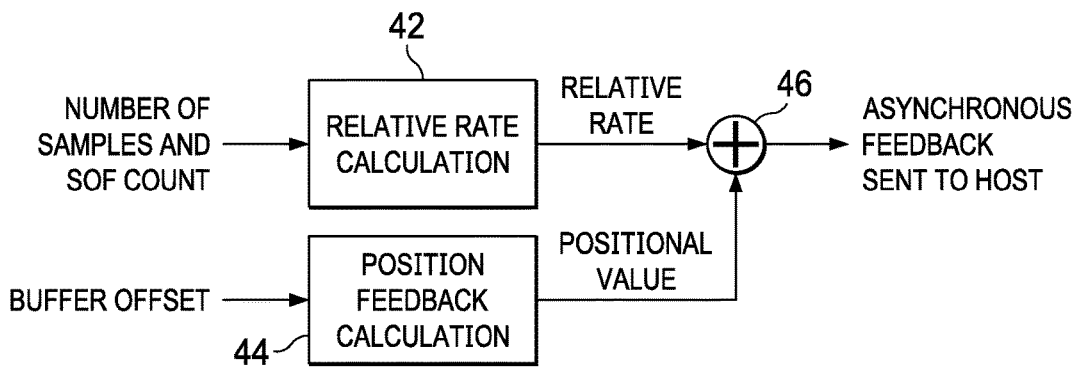
FIG. 6 illustrates a block diagram of an example method for calculating an asynchronous feedback value for communication from a device to a host, in accordance with embodiments of the present disclosure.

FIG. 6 illustrates a block diagram of an example method for calculating an asynchronous feedback value for communication from USB device 14 to USB host 12, in accordance with embodiments of the present disclosure. As shown in FIG. 6, a relative rate calculation block 42 may determine a relative rate based on a counted number of SOFs and a counted number of samples (e.g., as stored in hardware register 32) and a position feedback calculation block 44 may calculate a positional value based on a buffer offset (e.g., offset 30A or offset 30B). As mentioned above, such positional value may be obtained from a lookup table indexed by the buffer offset. As also shown in FIG. 6, a combiner 46 may combine the relative rate and the positional value in a manner to generate the asynchronous feedback information communicated from USB device 14 to USB host 12. For example, in some embodiments, combiner 46 may average the relative rate and the positional value to generate the asynchronous feedback information. In other embodiments, combiner 46 may scale the positional value and/or add it to the relative rate to generate the asynchronous feedback information.

Figure 7:
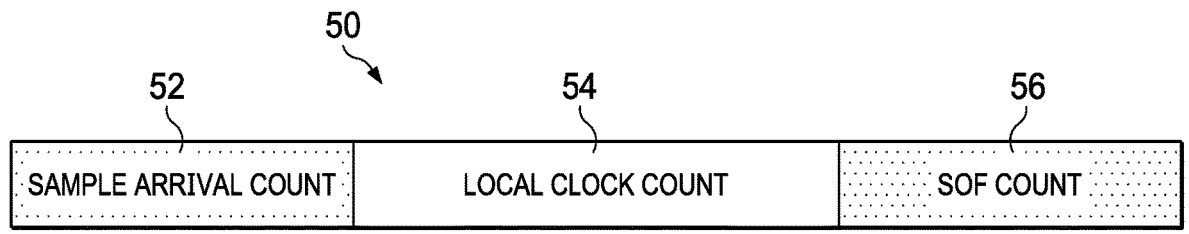
FIG. 7 illustrates a block diagram of a hardware register for storing information for determining phase information, in accordance with embodiments of the present disclosure.

In these and other embodiments, device controller 18 may use a counter fed with a sufficiently fast device clock to measure fractions of samples per frame. Using such a counter, the delta between frames can be used to calculate a phase delta between a host clock of USB host 12 and a local clock of USB device 14. Such phase information may be correlated to a buffer position and therefore can be used instead of buffer position to correct the feedback information communicated from USB device 14 to USB host 12. In some embodiments, device controller 18 may use the phase information to create a virtual phase locked loop with the asynchronous feedback information. For example, device controller 18 may maintain a hardware register 50 as shown in FIG. 7 that may include a field 52 for storing a counter of a number of data samples arrived at USB device 14, a field 54 for storing a counter of a number of local clock cycles, and a field 56 for storing a counter of a number of SOFs communicated from USB host 12 to USB device 14. Device controller 18 may control the virtual phase locked loop to adjust the asynchronous feedback information communicated from USB device 14 to USB host 12 based on the sample arrival count, the local clock count, and the SOF count, for example as depicted in FIG. 8, described below.

Figure 8:
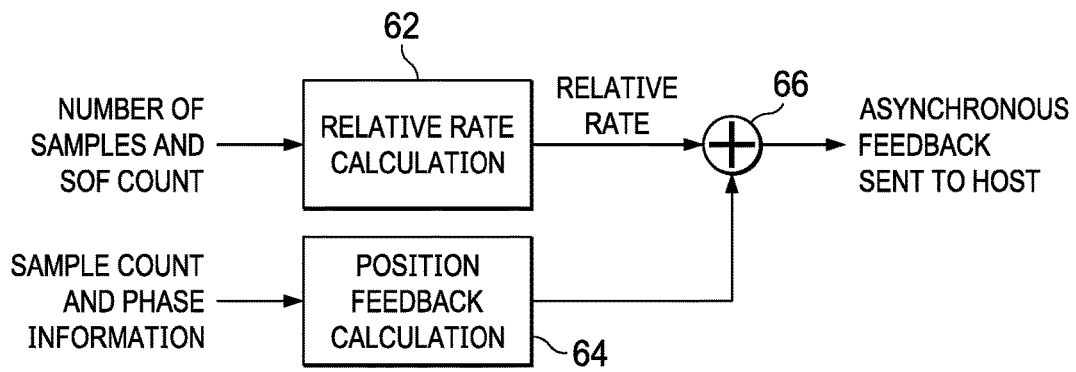
FIG. 8 illustrates a block diagram of another example method for calculating an asynchronous feedback value for communication from a device to a host, in accordance with embodiments of the present disclosure.

FIG. 8 illustrates a block diagram of another example method for calculating an asynchronous feedback value for communication from USB device 14 to USB host 12, in accordance with embodiments of the present disclosure. As shown in FIG. 8, a relative rate calculation block 62 may determine a relative rate based on a counted number of SOFs and a counted number of samples (e.g., as stored in hardware register 32) and a position feedback calculation 64 may calculate a positional value based on a buffer offset (e.g., offset 30A or offset 30B) and the phase information determined as described above. The phase calculation may provide information regarding how many additional samples are needed to account for a partial SOF which helps determine if USB device 14 is consuming samples slower or faster than it is receiving them from USB host 12. As also shown in FIG. 8, a combiner 66 may combine the relative rate and the positional value in some manner to generate the asynchronous feedback information communicated from USB device 14 to USB host 12.

While much discussion in this disclosure contemplates a USB host coupled via a USB interface to a USB device and communicating via a USB protocol, the methods and systems disclosed herein may also be applied to any other suitable type of host coupled to any suitable device via any suitable communication protocol interface and suitable communication protocol.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method of generating asynchronous feedback information for asynchronous, isochronous audio communication, comprising:
    determining a relative change of stored samples in a device; and
    generating the asynchronous feedback information provided to a host from the device based on the relative change.

2. The method of claim 1, further comprising:
    determining a relative rate of a host clock for the host and a device clock for the device; and
    generating the asynchronous feedback information provided to the host from the device based on the relative rate and the relative change.

3. The method of claim 2, further comprising:
    determining a relative phase of the host clock and the device clock; and
    generating the asynchronous feedback information provided to the host from the device based on the relative phase, the relative change, and the relative rate.

4. The method of claim 3, further comprising:
    counting a number of start-of-frame markers received by the device from the host;
    counting a number of samples received by the device from the host;
    counting a number of local clock cycles of the local clock; and
    controlling a virtual phase locked loop to generate the asynchronous feedback information based on the number of start-of-frame markers, number of samples, and number of local clock cycles.

5. The method of claim 2, wherein the relative rate is determined by:
    counting a number of start-of-frame markers received by the device from the host;
    counting a number of samples received by the device from the host; and
    determine a number of samples received per start-of-frame period.

6. The method of claim 1, further comprising generating the asynchronous feedback information provided from the device to the host based only on the relative change.

7. The method of claim 1, wherein the audio communication is conducted via a Universal Serial Bus protocol.

8. A method of generating asynchronous feedback information for asynchronous, isochronous audio communication, comprising:
    determining a relative phase of a host clock for a host and a device clock for a device; and
    generating the asynchronous feedback information provided to the host from the device based on the relative phase.

9. The method of claim 8, further comprising:
    counting a number of start-of-frame markers received by the device from the host;
    counting a number of samples received by the device from the host;
    counting a number of local clock cycles of the local clock; and
    controlling a virtual phase locked loop to generate the asynchronous feedback information based on the number of start-of-frame markers, number of samples, and number of local clock cycles.

10. The method of claim 8, further comprising:
    determining a relative rate of the host clock and the device clock; and
    generating the asynchronous feedback information provided to the host from the device based on the relative rate and the relative phase.

11. The method of claim 10, wherein the relative rate is determined by:
    counting a number of start-of-frame markers received by the device from the host;
    counting a number of samples received by the device from the host; and
    determine a number of samples received per start-of-frame period.

12. The method of claim 8, wherein the audio communication is conducted via a Universal Serial Bus protocol.

13. A device, comprising:
    a bus interface for communicating with a host communicatively coupled to the device; and
    a controller communicatively coupled to the bus interface and configured to, in order to generate asynchronous feedback information for asynchronous, isochronous audio communication:
        determine a relative change of stored samples in the device; and
        generate the asynchronous feedback information provided to the host from the device based on the relative change.

14. The device of claim 13, wherein the controller is further configured to:
    determine a relative rate of a host clock for the host and a device clock for the device; and
    generate the asynchronous feedback information provided to the host from the device based on the relative rate and the relative change.

15. The device of claim 14, wherein the controller is further configured to:
    determine a relative phase of the host clock and the device clock; and
    generate the asynchronous feedback information provided to the host from the device based on the relative phase, the relative change, and the relative rate.

16. The device of claim 15, wherein the controller is further configured to:
    count a number of start-of-frame markers received by the device from the host;

count a number of samples received by the device from the host;

count a number of local clock cycles of the local clock; and control a virtual phase locked loop to generate the asynchronous feedback information based on the number of start-of-frame markers, number of samples, and number of local clock cycles.

17. The device of claim 14, wherein the controller is further configured to determine the relative rate:

counting a number of start-of-frame markers received by the device from the host;

counting a number of samples received by the device from the host; and determine a number of samples received per start-of-frame period.

18. The device of claim 13, wherein the controller is further configured to generate the asynchronous feedback information provided from the device to the host based only on the relative change.

19. The device of claim 13, wherein the audio communication is conducted via a Universal Serial Bus protocol.

20. A device, comprising:

a bus interface for communicating with a host communicatively coupled to the device; and a controller communicatively coupled to the bus interface and configured to, in order to generate asynchronous feedback information for asynchronous, isochronous audio communication:

determine a relative phase of a host clock for a host and a device clock for a device; and generate the asynchronous feedback information provided to the host from the device based on the relative phase.

21. The device of claim 20, wherein the controller is further configured to:

count a number of start-of-frame markers received by the device from the host;

count a number of samples received by the device from the host;

count a number of local clock cycles of the local clock; and control a virtual phase locked loop to generate the asynchronous feedback information based on the number of start-of-frame markers, number of samples, and number of local clock cycles.

22. The device of claim 20, wherein the controller is further configured to:

determine a relative rate of the host clock and the device clock; and generate the asynchronous feedback information provided to the host from the device based on the relative rate and the relative phase.

23. The device of claim 22, wherein the controller is further configured to determine the relative rate:

counting a number of start-of-frame markers received by the device from the host;

counting a number of samples received by the device from the host; and determine a number of samples received per start-of-frame period.

24. The device of claim 20, wherein the audio communication is conducted via a Universal Serial Bus protocol.

* * * * *